(12) United States Patent
Valer'Evich et al.

(10) Patent No.: US 10,337,915 B2
(45) Date of Patent: Jul. 2, 2019

(54) LIGHT-DETECTING DEVICE AND METHOD FOR CONVERTING OPTICAL RADIATION ON SWITCHED CONDUCTIVITY DIODES

(71) Applicant: PINNACLE IMAGING CORPORATION, Belmont, CA (US)

(72) Inventors: Vanjushin Igor' Valer'Evich, Moscow (RU); Klimkovich Anton Grigor'Evich, Moscow (RU); Volodin Evgeuij Borisovich, Moscow (RU)

(73) Assignee: Pinnacle Imaging Corporation, Belmont, CA (US)

( * ) Notice: Subject to any disclaimer, the term of this patent is extended or adjusted under 35 U.S.C. 154(b) by 0 days.

(21) Appl. No.: 15/604,838

(22) Filed: May 25, 2017

(65) Prior Publication Data

US 2017/0261373 A1 Sep. 14, 2017

Related U.S. Application Data

(63) Continuation of application No. 14/272,661, filed on May 8, 2014, now Pat. No. 9,752,929.

(51) Int. Cl.
*G01J 1/44* (2006.01)
*G01J 1/18* (2006.01)
(Continued)

(52) U.S. Cl.
CPC .............. *G01J 1/44* (2013.01); *G01J 1/18* (2013.01); *H01L 27/14609* (2013.01);
(Continued)

(58) Field of Classification Search
CPC .. G01J 1/18; G01J 2001/186; G01J 2001/446; H03M 1/34
See application file for complete search history.

(56) References Cited

U.S. PATENT DOCUMENTS 3,654,476 A * 4/1972 Hakki .................... H04N 5/374
250/552
5,153,423 A * 10/1992 Conrads .................... G01J 1/44
250/208.1
(Continued)

FOREIGN PATENT DOCUMENTS

WO    WO 2005036156 A1 * 4/2005 ......... G01N 27/4145

OTHER PUBLICATIONS

El Gamal, Abbas. "High dynamic range image sensors." Tutorial at International Solid-State Circuits Conference. vol. 290. 2002.*

*Primary Examiner* — Tri Ton
*Assistant Examiner* — Rufus Phillips
(74) *Attorney, Agent, or Firm* — Rosenberg, Klein & Lee

(57) ABSTRACT

A light-detecting device and method for converting optical radiation on switched conductivity diodes. The device comprises one or more photosensitive cells connected to address and signal lines, each cell comprising the following elements connected in series: a photodetector, an initial charge input circuit, a charge converter for converting the charge generated by the photodetector signal in addition to the initial charge into photodetector output voltage, a comparator which converts the difference between the photodetector output voltage and reference voltage into a digital cell signal, a reading circuit for reading the digital cell signal through the address lines and the signal lines, a circuit for generating digital codes of the cell signal, a random access memory for storing the digital codes, a reading circuit for reading the digital codes of the cell signals on one or more outputs of the light-detecting device.

8 Claims, 6 Drawing Sheets

(51) Int. Cl.
  *H01L 27/146* (2006.01)
  *H03M 1/34* (2006.01)
(52) U.S. Cl.
  CPC ... *G01J 2001/186* (2013.01); *G01J 2001/446* (2013.01); *H03M 1/34* (2013.01)

(56) References Cited

U.S. PATENT DOCUMENTS

| | | | | |
|---|---|---|---|---|
| 6,280,081 B1* | 8/2001 | Blau | ............... | G01J 1/18 |
| | | | | 323/316 |
| 6,316,716 B1* | 11/2001 | Hilgrath | ............ | H01L 31/0687 |
| | | | | 136/249 |
| 8,253,809 B2* | 8/2012 | Nishi | ............... | H03M 1/123 |
| | | | | 341/126 |
| 8,513,892 B2* | 8/2013 | Uedaira | ............ | G01J 1/02 |
| | | | | 315/158 |

* cited by examiner

LIGHT-DETECTING DEVICE AND METHOD FOR CONVERTING OPTICAL RADIATION ON SWITCHED CONDUCTIVITY DIODES

This application is a Continuation of co-pending application Ser. No. 14/272,661, filed on May 8, 2014, currently pending, for which priority is claimed under 35 U.S.C. § 120 and the entire contents of all of which are hereby incorporated by reference.

BACKGROUND OF THE INVENTION

Field of the Invention

The present invention relates to digital imaging. More specifically, the present invention discloses a method and light-detecting device for analogue-to-digital conversion of optical radiation on switched conductivity diodes.

Description of the Prior Art

Conventional methods of analog-to-digital conversion and light-detecting devices use analogue-to-digital conversion in cells. Traditionally devices use a digital pixel sensor with integrated charge transfer amplifier, a per column one-bit analogue-to-digital converter for image sensors, or a complementary metal oxide semiconductor imager with an analogue-to-digital pixel converter.

While some of these conventional methods can have a high degree of protection from the nonlinear distortion and interference in circuits for reading and transmitting photodetector signals a major disadvantage lies in high cell complexity.

The disadvantages of the conventional devices lies in complexity which prevents reduction in the cell size and thus increase the spatial resolution of the light-detecting device, and also reducing a portion of the cell area exposed to the radiation received, i.e. reducing the equivalent quantum efficiency.

Therefore, there is need for an efficient method and improved light-detecting device for increasing spatial resolution at high equivalent quantum efficiency.

SUMMARY OF THE INVENTION

To achieve these and other advantages and in order to overcome the disadvantages of the conventional method in accordance with the purpose of the invention as embodied and broadly described herein, the present invention provides a method light-detecting device for analogue-to-digital conversion of optical radiation on switched conductivity diodes.

An object of the present invention is to provide an increase of spatial resolution at high equivalent quantum efficiency.

To achieve this objective and provide additional advantages the method of the present invention for analogue-to-digital conversion of optical radiation, comprises converting the optical radiation into photocurrent, integrating the photocurrent over the exposure time into an electric charge which changes the initial charge input before exposure, converting the resultant charge into signal voltage, comparing the signal voltage with a reference voltage and switching the comparator as the comparison result, generating binary signals modulated on the time of switching relative to the initial time, generating digital codes based thereon, and storing the digital codes and successively sending said codes to outputs.

The initial charge is input into the switched conductivity diode by applying a voltage corresponding to the initial charge in the forward direction at the variation rate which causes injection of minority carriers, which does not exceed the level of triggering the switching diode into the conducting state, and by applying a corresponding sampling voltage as the reference voltage at a variation rate sufficiently high to cause injection of minority carriers, needed for triggering thereof upon reaching voltage corresponding to the resultant charge, with given accuracy, wherein to improve the device which realizes this method, said device comprising one or more photosensitive cells connected to address lines and signal lines, each cell comprising the following elements connected in series: a photodetector, an initial charge input circuit, a charge converter for converting the charge generated by the photodetector signal additionally to the initial charge into output voltage of the photodetector, a comparator which converts the difference between the photodetector output voltage and a reference voltage into a digital cell signal, a reading circuit for reading the digital cell signal through the address lines and the signal lines, a circuit for generating digital codes of the cell signals, random access memory for storing the digital codes, a reading circuit for reading the digital codes of the cell signals on one or more outputs of the light-detecting device.

To configure the photodetector, the initial charge input circuit, the charge converter and the comparator in a cell in the form of a tunnel switching diode in a MIS (metal, insulator, semiconductor) structure, one of the leads of which is connected to the address line and the other is connected to the signal line.

Other features of the method and light-detecting device comprise:
  applying the reference sampling voltage linearly or gradually variable,
  sending the switching diode signals to outputs successively in the form of pulse-width modulated binary signals,
  generating digital codes of switching diode signals according to their switching time relative to the initial time by multiple periodical sampling of each switching diode state over the exposure time, registering the quantities of samplings taken with integrators for the switching diode at certain state and not registering the quantity for the diode at another state, exchanging intermediate results between the integrators and memory cells of the digital codes of switching diode signals while cyclically switching the integrators to other switching diodes, sending the digital codes from the memory cells to the outputs over the exposure time for corresponding photosensitive switching diodes,
  configuring the photodetector, the initial charge input circuit, the charge converter and the comparator in the form of a switching diode in an n-p-n-p semiconductor structure within a cell,—to configure a MIS tunnel switching diode cell on a semiconductor substrate of a first conductivity type comprising a cell enveloping and isolating area, having the same conductivity type as the substrate's, an ohmic contact on its surface and having impurity element concentration gradient which creates an electric field, which injects minority carriers into the inner area of the opposite conductivity type, wherein it is formed an electrode separated therefrom in a tunnel manner with a thin dielectric, and the first conductivity type area being able to inject minority carriers into the inner area and to the tunnel dielectric, having an ohmic contact with a p-n junction electrode,
  configuring the sides of the cell enveloping and isolating area having the same conductivity type as the substrate's in the form of isolation channels, configuring the reading circuit for reading the digital cell signal through the address lines and the signal lines, the circuit for generating digital codes of the cell signals, the random access memory for storing the digital codes, the reading circuit for reading the digital codes of the cell signals on one or more outputs of the light-detecting device with image conversion and data condensation circuit elements integrated into each circuit or any combination thereof.

Increase of spatial resolution at high equivalent quantum efficiency is achieved due to the functional integration of the photodetector, the initial charge input circuit, the charge converter and the comparator in areas of a tunnel switching diode, not exceeding a MOS transistor by size, wherein analogue-to-digital conversion method as suggested is applied.

For submicron CMOS technology the cell size reduction in the light-detecting device as suggested is limited only by the diffraction limit, corresponding to the cell density of about $3 \cdot 10^7$ cm$^{-2}$.

Since the data in a matrix light-detecting device unlike in the eye is output through a limited number of outputs, under normal vertical frequency (100 Hz) the reading frequency becomes extremely high—up to 10 Gbit/s.

Therefore, in order to reduce the number of the outputs and/or to reduce the clock rate of the cell signals output therethrough (about 10-100 times), image conversion and data condensation circuit elements are integrated into the light-detecting device peripheral circuits.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
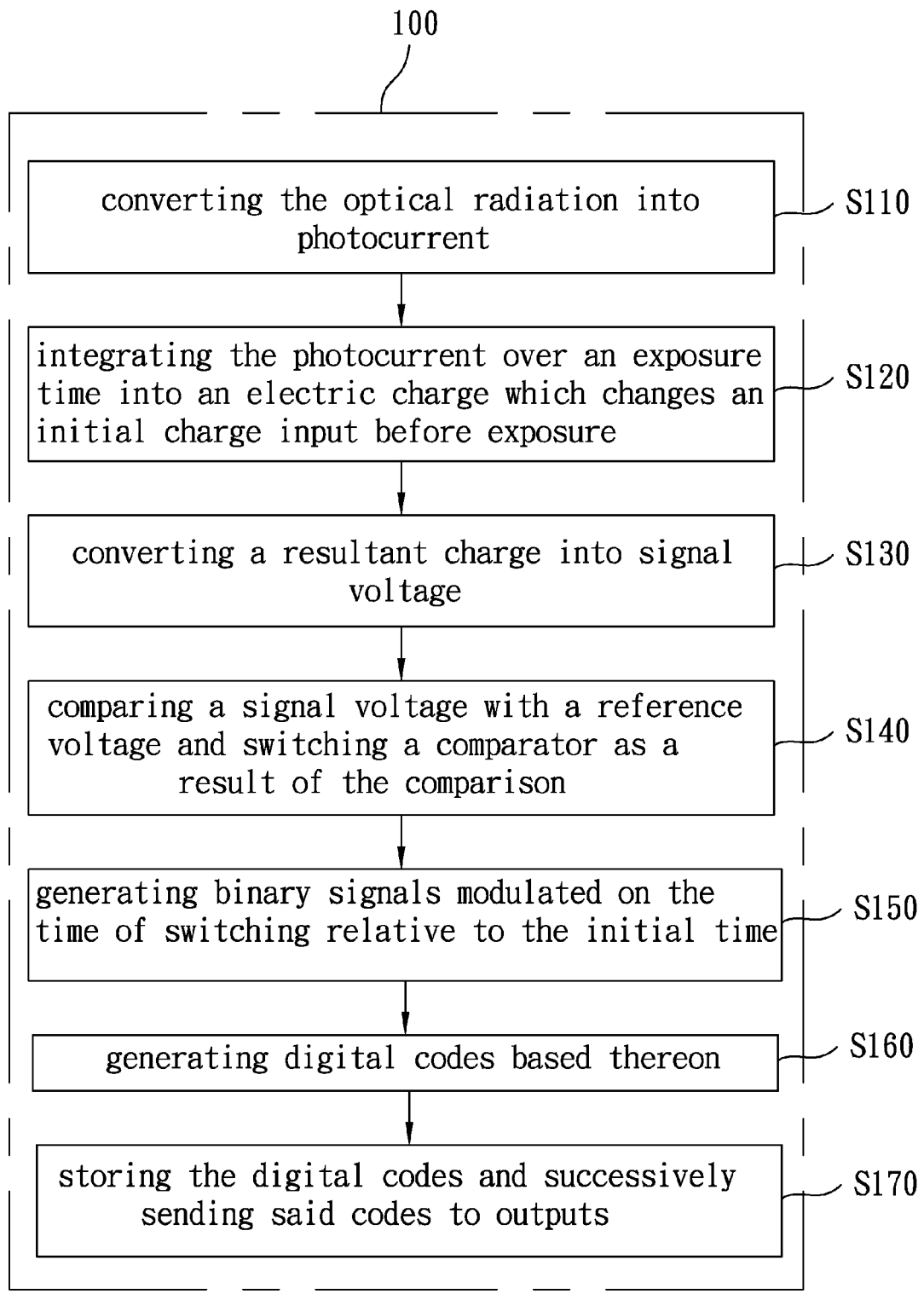
FIG. 1 is a drawing illustrating a method for analogue-to-digital conversion of optical radiation on a switched conductivity diode according to an embodiment of the present invention.
Figure 2:
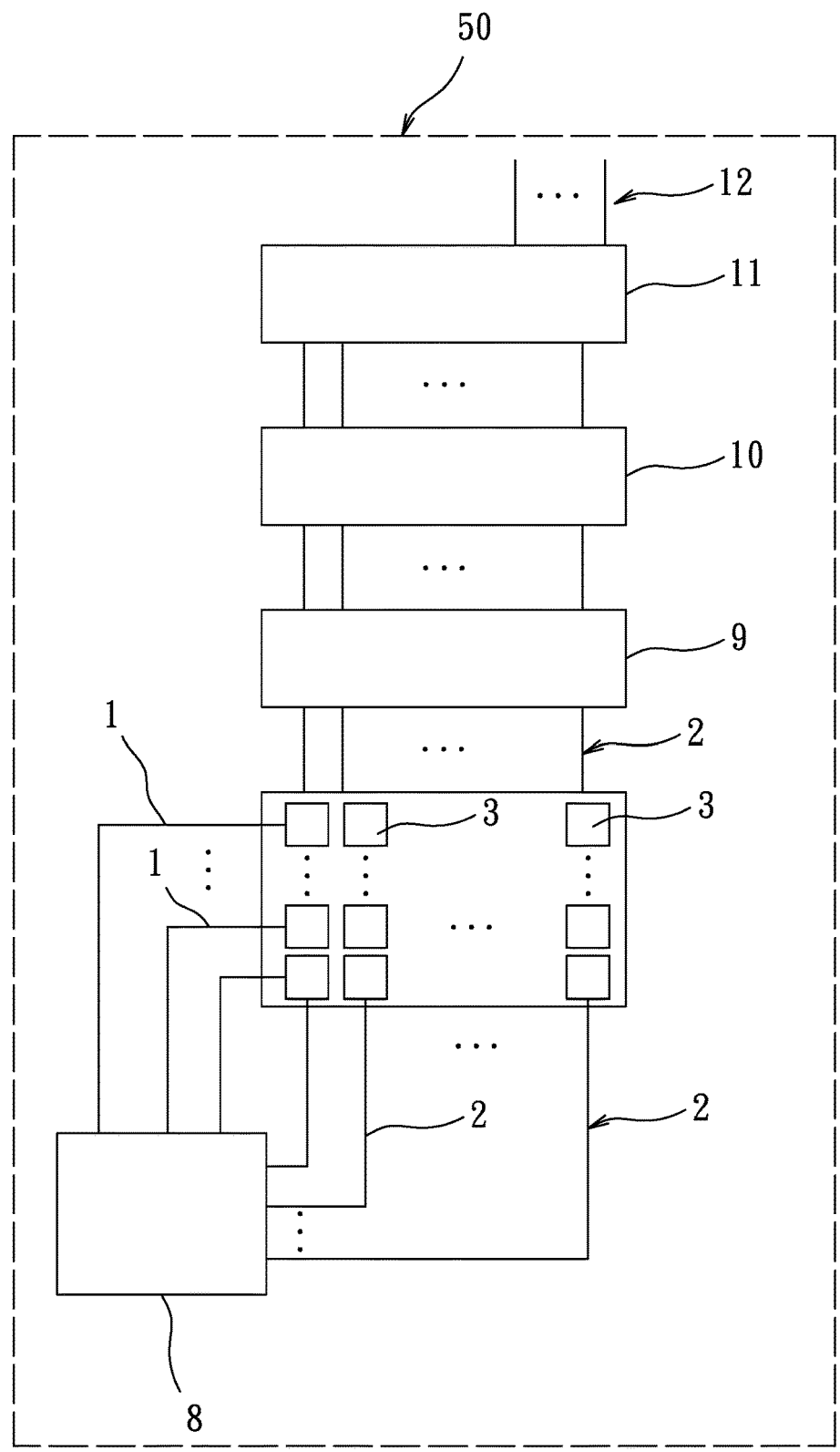
FIG. 2 is a drawing illustrating a light-detecting device with analogue-to-digital conversion according to an embodiment of the present.
Figure 3A:
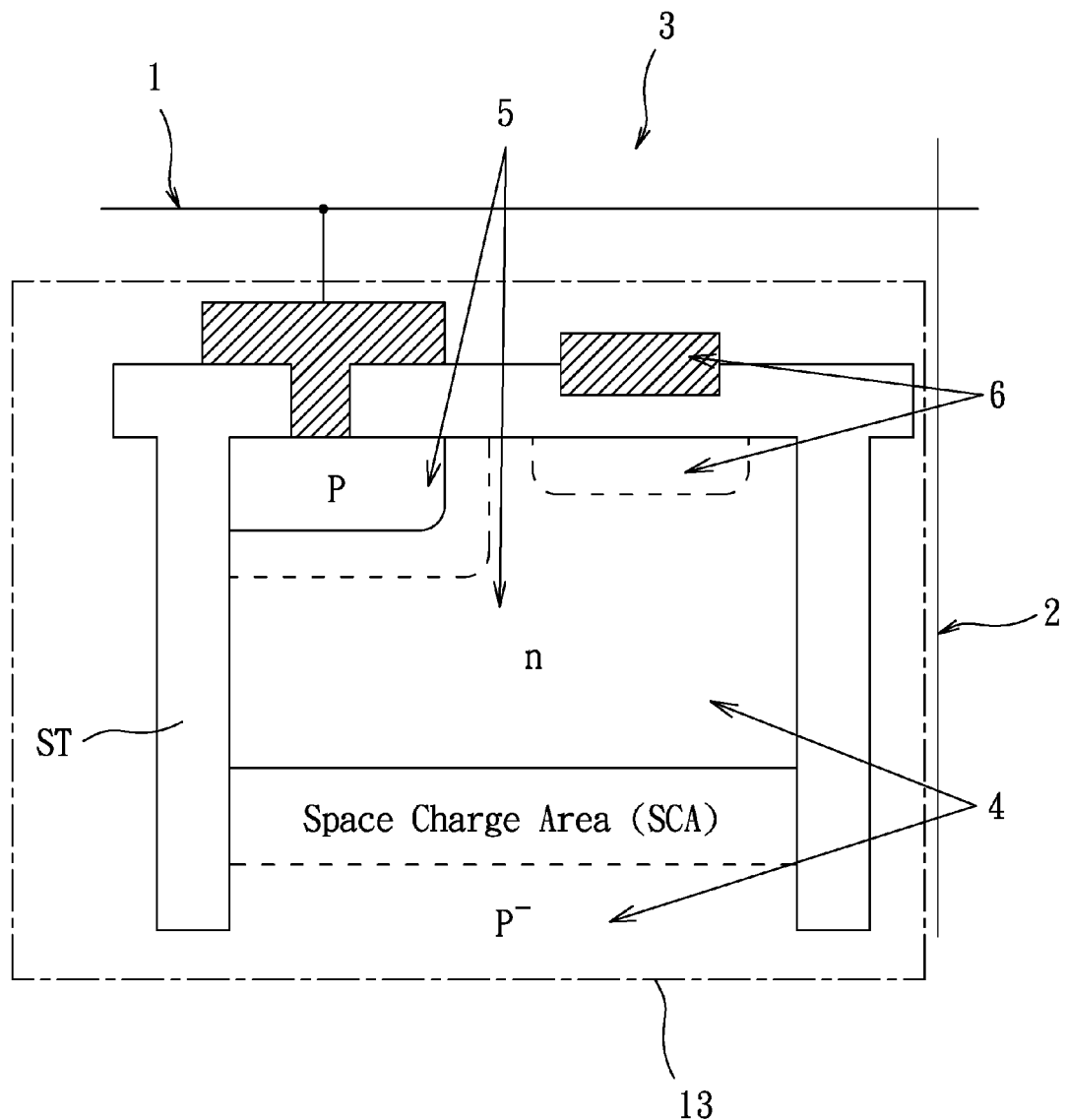
FIG. 3A is a drawing illustrating a cell structure for the light-detecting device comprising insulation channels formed by means of etching.
Figure 3B:
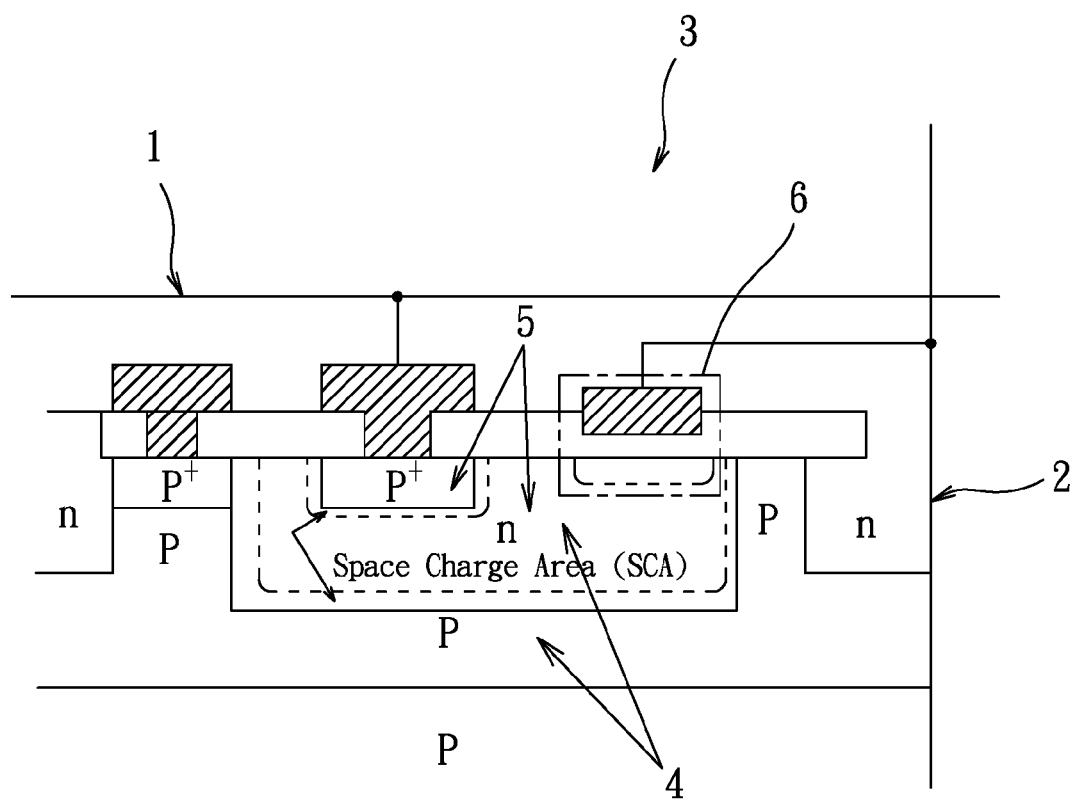
FIG. 3B is a drawing illustrating a cell structure for the light-detecting device comprising an insulating area formed by means of impurity elements.
Figure 4:
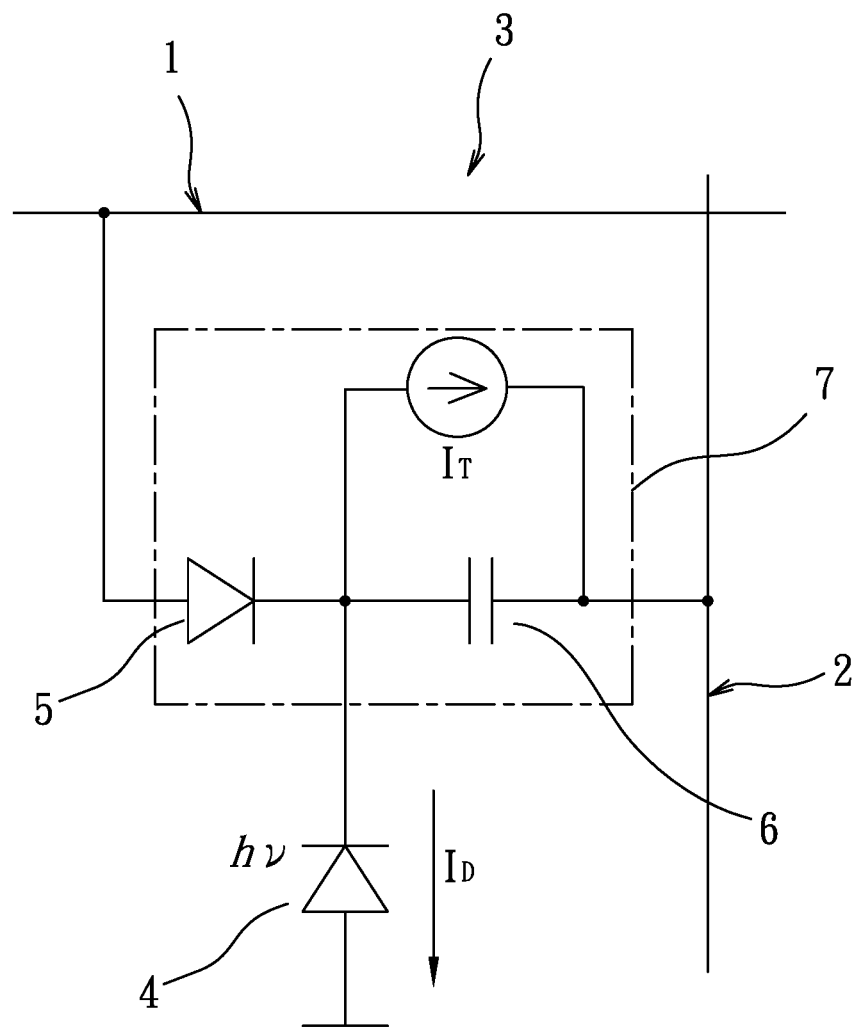
FIG. 4 is a drawing illustrating an equivalent circuit diagram of a cell for the light-detecting device ($I_T$—tunneling current through a thin subelectrode dielectric, $I_D$—photodetector current)
Figure 5:
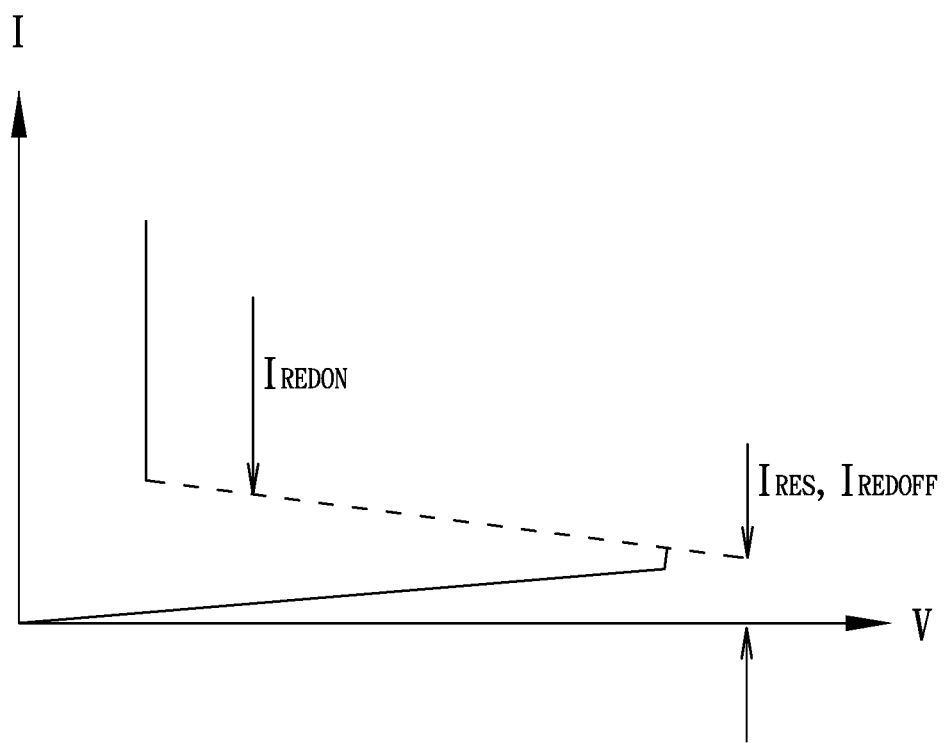
FIG. 5 is a drawing illustrating the current-voltage characteristics of MIS tunnel switching diode explaining the cell functioning modes ($I_{RES}$—initial charge input current, $I_{RE-DON}$—reading current when switched on, $I_{REDON} \gg I_{RES}$, $I_{REDOFF} \ll I_{RES}$ when switched off).

Reference will now be made in detail to the preferred embodiments of the present invention, examples of which are illustrated in the accompanying drawings. Wherever possible, the same reference numbers are used in the drawings and the description to refer to the same or like parts.

Refer to FIG. 1.

The method 100 of the present invention for analogue-to-digital conversion of optical radiation on a switched conductivity diode comprises converting the radiation into photocurrent in Step 110. In Step 120, integrating the photocurrent over the exposure time into an electric charge which changes the initial charge input before exposure. Next, in Step 130, converting the resultant charge into signal voltage, and in Step 140 comparing the signal voltage with a reference voltage and switching a comparator as the comparison result. In Step 150, generating binary signals modulated on the time of switching relative to the initial time, and in Step 160 generating digital codes based thereon. In Step 170, storing the digital codes and successively sending said codes to outputs.

The method is characterized in that in order to input the initial charge into the switched conductivity diode the voltage corresponding to the initial charge is applied thereto in the forward direction at a variation rate which causes injection of minority carriers, which does not exceed the level of triggering the switching diode into the conducting state, and the corresponding sampling voltage is applied thereto as the reference voltage at a variation rate sufficiently high to cause injection of minority carriers, needed for triggering thereof upon reaching voltage corresponding to the resultant charge, with given accuracy.

Refer to FIGS. 2-5.

The light-detecting device 50 with analogue-to-digital conversion comprises one or more photosensitive cells 3 connected to address lines 1 and signal lines 2, each cell comprising the following elements connected in series: a photodetector 4, an initial charge input circuit (p-n junction) 5, a charge converter (MIS capacitor) 6 for converting the charge generated by a photodetector signal additionally to the initial charge into photodetector output voltage, a comparator 7 which converts the difference between the photodetector output voltage (at the charge capacity) and a reference voltage (being input to the line 2 while sampling) into a digital cell signal, a reading circuit 8 for reading the digital cell signal through the address lines and the signal lines, a circuit 9 for generating digital codes of the cell signals, a random access memory 10 for storing the digital codes, a reading circuit 11 for reading the digital codes of the cell signals on one or more outputs 12 of the light-detecting device 50, wherein according to the invention, in a cell 3, the photodetector 4, the initial charge input circuit 5, the charge converter 6 and the comparator 7 are configured in the form of a MIS tunnel switching diode 13, one of the leads of which is connected to the address line 1 and the other is connected to the signal one 2, and the circuits 8, 9, 10, 11 may contain image conversion and data condensation circuit elements.

The light-detecting device 50 operates as follows: in cells 3, the photodetector 4 converts the radiation into photocurrent ID over the exposure time, integrates the photocurrent into an electric charge (at the resulting capacity of the MIS capacitor 6, the photodetector 4 and the p-n junction 5, which changes the initial charge input through the line 1 before exposure by applying to the p-n junction 5 voltage corresponding to the initial charge in the forward direction at the variation rate (for example, $10^3$ V/s), thus causing injection IRES of minority carriers, which does not exceed the level of triggering the cell into the conducting state, converts the resultant charge into the signal voltage, compares the signal voltage with a reference voltage, which is supplied by the circuit 8 while sampling to the line 1 and is linearly or gradually variable at a variation rate (for example, $10^5$ V/s) sufficiently high to cause injection IREDON of minority carriers, needed for triggering thereof upon reaching voltage corresponding to the resultant charge, with given accuracy, yet allowing for generating digital codes of the cell signals according to their switching time relative to the initial time of the sampling reference voltage by means of clock pulse registering (for example, at a frequency of 100 MHz) performed in the circuit 9, stores the generated digital codes (for example, 10-bit ones) in the random access memory 10 and successively sends said codes through the reading circuit 11 on the outputs 12.

According to another embodiment, cell signals are generated according to their switching time relative to the initial time of the sampling reference voltage by means of the reading circuit 8 pixel by pixel or in groups of pixels in the form of pulse-width modulated signals, the signals being output directly, escaping integrators 9 and memory cells 10, to one or more corresponding outputs 12.

According to another embodiment, cell signals are generated according to their switching time relative to the initial time of exposure by multiple periodical sampling of the state of each cell 3 over the exposure time, registering the quantity of samplings taken with integrators 9 for the cells at certain state and not registering the quantity for the cells at another state, exchanging intermediate results between the integrators 9 and memory cells 10 of the digital codes of the cell signals while cyclically switching the integrators 9 to other cells, sending the digital codes from the memory cells 10 to the outputs 12 over the exposure time for corresponding photosensitive cells.

The reference voltage pulse width in the course of row sampling is considerably reduced and due to its variation rate increase improves the triggering accuracy of a cell as a comparator.

As detailed above, the present invention provides high spatial resolution with high equivalent quantum efficiency. The method for analogue-to-digital conversion of optical radiation involves converting the radiation into photocurrent, integrating the photocurrent over the exposure time into an electric charge which changes the initial charge input before exposure, converting the resultant charge into signal voltage, comparing the signal voltage with reference voltage and switching the comparator as the comparison result, generating binary signals modulated on the time of switching relative to the initial time, generating digital codes based thereon, storing the digital codes and successively sending said codes to outputs, wherein the initial charge is input into the switched conductivity diode by applying voltage corresponding to the initial charge in the forward direction at a variation rate which causes injection of minority carriers, which does not exceed the level of triggering the switching diode into the conducting state, and the reference voltage applied is the corresponding sampling voltage at a variation rate sufficiently high to cause injection of minority carriers, needed for triggering thereof upon reaching voltage corresponding to the resultant charge, with given accuracy.

The light-detecting device of the present invention realizing this method has one or more photosensitive cells connected to address and signal lines, each cell comprising the following elements connected in series: a photodetector, an initial charge input circuit, a charge converter for converting the charge generated by the photodetector signal in addition to the initial charge into photodetector output voltage, a comparator which converts the difference between the photodetector output voltage and reference voltage into a digital cell signal, a reading circuit for reading the digital cell signal through the address lines and the signal lines, a circuit for generating digital codes of the cell signal, a random access memory for storing the digital codes, a reading circuit for reading the digital codes of the cell signals on one or more outputs of the light-detecting device, wherein in the cell, the photodetector, the initial charge input circuit, the charge converter and the comparator are provided in the form of a tunnel switching electrode in a MIS (metal, insulator, semiconductor) structure one of the outputs of which is connected to the address line and the other is connected to the signal line.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A method for analogue-to-digital conversion of optical radiation on a metal insulator semiconductor switch diode comprising:
    converting the optical radiation into photocurrent;
    integrating the photocurrent over an exposure time into an electric charge which changes an initial charge input before exposure;
    inputting the initial charge into an initial charge input circuit comprising a metal insulator semiconductor switch diode, the initial charge input circuit directly connected to an address line;
    converting a resultant charge into signal voltage by a charge converter, the charge converter comprising a capacitance formed by a metal insulator semiconductor switch diode and adjacent charge accumulating areas, for converting the charge generated by a photodetector signal additionally to the initial charge into photodetector output voltage, the charge converter directly connected to a signal line and the initial charge input circuit;
    comparing a signal voltage with a reference voltage and switching a comparator as a result of the comparison;
        wherein the initial charge input circuit, the charge converter and the comparator are configured in the form of a tunnel switching electrode in a metal insulator-semiconductor structure;
    generating binary signals modulated on switching time relative to initial time,
    generating digital codes based on the binary signals; and
    storing the digital codes and successively sending the digital codes to outputs;
        where in order to input the initial charge into the metal insulator semiconductor switch diode, voltage corresponding to the initial charge is applied in a forward direction at a variation rate which causes injection of minority carriers, which does not exceed a level of triggering the metal insulator semiconductor switch diode into the conducting state, and the corresponding sampling voltage is applied as the reference voltage at a variation rate sufficiently high to cause injection of minority carriers, needed for triggering upon reaching voltage corresponding to the resultant charge, with given accuracy.

2. The method of claim 1, wherein the reference sampling voltage is applied linearly.

3. The method of claim 1, wherein the reference sampling voltage is applied gradually variable.

4. The method of claim 2, wherein the metal insulator semiconductor switch diode signals are successively sent to the output as pulse-width modulated binary signals.

5. The method of claim 3, wherein the metal insulator semiconductor switch diode signals are successively sent to the output as pulse-width modulated binary signals.

6. The method of claim 1, wherein the digital codes of metal insulator semiconductor switch diode signals are generated according to their switching time relative to the initial time by multiple periodical sampling of the state of each metal insulator semiconductor switch diode over the exposure time, registering the quantity of samplings taken with integrators for the metal insulator semiconductor switch diode at certain state and not registering the quantity for the diode at another state, exchanging intermediate results between the integrators and memory cells of the digital codes of the metal insulator semiconductor switch diode signals while cyclically switching the integrators to other metal insulator semiconductor switch diodes, sending the digital codes from the memory cells to the outputs over the exposure time for corresponding photosensitive metal insulator semiconductor switch diodes.

7. A method for analogue-to-digital conversion of optical radiation on a metal insulator semiconductor switch diode comprising:
converting the optical radiation into photocurrent;
integrating the photocurrent over an exposure time into an electric charge which changes an initial charge input before exposure;
inputting the initial charge into an initial charge input circuit comprising a metal insulator semiconductor switch diode, the initial charge input circuit directly connected to an address line;
converting a resultant charge into signal voltage by a charge converter, the charge converter comprising a capacitance formed by a metal insulator semiconductor switch diode and adjacent charge accumulating areas, for converting the charge generated by a photodetector signal additionally to the initial charge into photodetector output voltage, the charge converter directly connected to a signal line and the initial charge input circuit, the metal insulator semiconductor switch diode and adjacent charge accumulating areas forming a capacitance affecting the resultant charge;
comparing a signal voltage with a reference voltage and switching a comparator as a result of the comparison;
wherein the initial charge input circuit, the charge converter and the comparator are configured in the form of a tunnel switching electrode in a metal insulator-semiconductor structure;
generating binary signals modulated on switching time relative to initial time,
generating digital codes based on the binary signals; and
storing the digital codes and successively sending the digital codes to outputs;
where in order to input the initial charge into the metal insulator semiconductor switch diode, voltage corresponding to the initial charge is applied in a forward direction at a variation rate which causes injection of minority carriers, which does not exceed a level of triggering the metal insulator semiconductor switch diode into the conducting state, and the corresponding sampling voltage is applied as the reference voltage at a variation rate sufficiently high to cause injection of minority carriers, needed for triggering upon reaching voltage corresponding to the resultant charge, with given accuracy;
wherein the digital codes of metal insulator semiconductor switch diode signals are generated according to their switching time relative to the initial time by multiple periodical sampling of the state of each metal insulator semiconductor switch diode over the exposure time, registering the quantity of samplings taken with integrators for the metal insulator semiconductor switch diode at certain state and not registering the quantity for the diode at another state, exchanging intermediate results between the integrators and memory cells of the digital codes of the metal insulator semiconductor switch diode signals while cyclically switching the integrators to other metal insulator semiconductor switch diodes, sending the digital codes from the memory cells to the outputs over the exposure time for corresponding photosensitive metal insulator semiconductor switch diodes;
wherein the reference sampling voltage is applied linearly; and
wherein the metal insulator semiconductor switch diode signals are successively sent to the output as pulse-width modulated binary signals.

8. A method for analogue-to-digital conversion of optical radiation on a metal insulator semiconductor switch diode comprising:
converting the optical radiation into photocurrent;
integrating the photocurrent over an exposure time into an electric charge which changes an initial charge input before exposure;
inputting the initial charge into an initial charge input circuit comprising a metal insulator semiconductor switch diode, the initial charge input circuit directly connected to an address line;
converting a resultant charge into signal voltage by a charge converter, the charge converter comprising a capacitance formed by a metal insulator semiconductor switch diode and adjacent charge accumulating areas, for converting the charge generated by a photodetector signal additionally to the initial charge into photodetector output voltage, the charge converter directly connected to a signal line and the initial charge input circuit, the metal insulator semiconductor switch diode and adjacent charge accumulating areas forming a capacitance affecting the resultant charge;
comparing a signal voltage with a reference voltage and switching a comparator as a result of the comparison;
wherein the initial charge input circuit, the charge converter and the comparator are configured in the form of a tunnel switching electrode in a metal insulator-semiconductor structure;
generating binary signals modulated on switching time relative to initial time,
generating digital codes based on the binary signals; and
storing the digital codes and successively sending the digital codes to outputs;
where in order to input the initial charge into the metal insulator semiconductor switch diode, voltage corresponding to the initial charge is applied in a forward direction at a variation rate which causes injection of minority carriers, which does not exceed a level of triggering the metal insulator semiconductor switch diode into the conducting state, and the corresponding sampling voltage is applied as the reference voltage at a variation rate sufficiently high to cause injection of minority carriers, needed for triggering upon reaching voltage corresponding to the resultant charge, with given accuracy;

wherein the digital codes of metal insulator semiconductor switch diode signals are generated according to their switching time relative to the initial time by multiple periodical sampling of the state of each metal insulator semiconductor switch diode over the exposure time, registering the quantity of samplings taken with integrators for the metal insulator semiconductor switch diode at certain state and not registering the quantity for the diode at another state, exchanging intermediate results between the integrators and memory cells of the digital codes of the metal insulator semiconductor switch diode signals while cyclically switching the integrators to other metal insulator semiconductor switch diodes, sending the digital codes from the memory cells to the outputs over the exposure time for corresponding photosensitive metal insulator semiconductor switch diodes;

wherein the reference sampling voltage is applied gradually variable; and wherein the metal insulator semiconductor switch diode signals are successively sent to the output as pulse-width modulated binary signals.

* * * * *